(12) United States Patent
Herrmann et al.

(10) Patent No.: US 10,203,074 B2
(45) Date of Patent: Feb. 12, 2019

(54) LIGHT-EMITTING DIODE AND LIGHTING MODULE

(71) Applicant: OSRAM GmbH, Munich (DE)

(72) Inventors: Siegfried Herrmann, Neukirchen (DE); Markus Pindl, Tegernheim (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/593,150

(22) Filed: May 11, 2017

(65) Prior Publication Data
US 2017/0328525 A1    Nov. 16, 2017

(30) Foreign Application Priority Data
May 11, 2016    (DE) .......... 10 2016 108 692

(51) Int. Cl.
| | |
|---|---|
| *F21V 21/00* | (2006.01) |
| *F21S 4/00* | (2016.01) |
| *F21K 9/69* | (2016.01) |
| *F21V 5/04* | (2006.01) |
| *H01L 25/075* | (2006.01) |
| *H01L 33/48* | (2010.01) |
| *F21Y 113/17* | (2016.01) |
| *F21Y 115/10* | (2016.01) |
| *H01L 33/54* | (2010.01) |
| *H01L 33/60* | (2010.01) |

(52) U.S. Cl.
CPC ............ *F21K 9/69* (2016.08); *F21V 5/04* (2013.01); *F21V 5/045* (2013.01); *H01L 25/0753* (2013.01); *H01L 33/483* (2013.01); *F21Y 2113/17* (2016.08); *F21Y 2115/10* (2016.08); *H01L 33/486* (2013.01); *H01L 33/54* (2013.01); *H01L 33/60* (2013.01); *H01L 2933/0091* (2013.01)

(58) Field of Classification Search
CPC . H01L 2924/00014; H01L 2224/48091; H01L 2924/181; H01L 33/486; H01L 33/60; H01L 2933/005; H01L 2924/12041; F21Y 2115/10; F21Y 2105/10
USPC .................................................... 362/249.06
See application file for complete search history.

(56) References Cited

U.S. PATENT DOCUMENTS

| | | | |
|---|---|---|---|
| 9,190,394 B2 | 11/2015 | Singer et al. | |
| 2005/0199899 A1* | 9/2005 | Lin ...................... | H01L 25/0753 257/99 |
| 2007/0222801 A1* | 9/2007 | Whitehead .......... | G02B 5/0236 345/697 |
| 2008/0002403 A1* | 1/2008 | Kim .................. | G02F 1/133603 362/240 |
| 2008/0037248 A1* | 2/2008 | Park .................. | G02F 1/133603 362/235 |

(Continued)

FOREIGN PATENT DOCUMENTS

| | | |
|---|---|---|
| JP | 2002368283 A | 12/2002 |
| WO | 2013045353 A1 | 4/2013 |

*Primary Examiner* — Thien M Le
(74) *Attorney, Agent, or Firm* — Slater Matsil, LLP

(57) ABSTRACT

A light-emitting diode and a light module are disclosed. In an embodiment the light-emitting diode includes at least one light-emitting diode chip and a first optical element, which is reflective for light generated by the at least one light-emitting diode chip during operation, wherein the first optical element completely covers at least one of the at least one light-emitting diode chip in a plan view.

17 Claims, 9 Drawing Sheets

(56) References Cited

U.S. PATENT DOCUMENTS

2008/0291362 A1* 11/2008 Whitehead ........ G02F 1/133603
                                                    349/64
2010/0118530 A1   5/2010 Nagai
2010/0127284 A1   5/2010 Nagai
2012/0099046 A1* 4/2012 Kasai ................ G02F 1/133603
                                                    349/61
2014/0334149 A1* 11/2014 Nolan .................... F21V 5/007
                                                    362/235
2015/0263239 A1* 9/2015 Watanabe ............... F21V 13/14
                                                    362/293

* cited by examiner

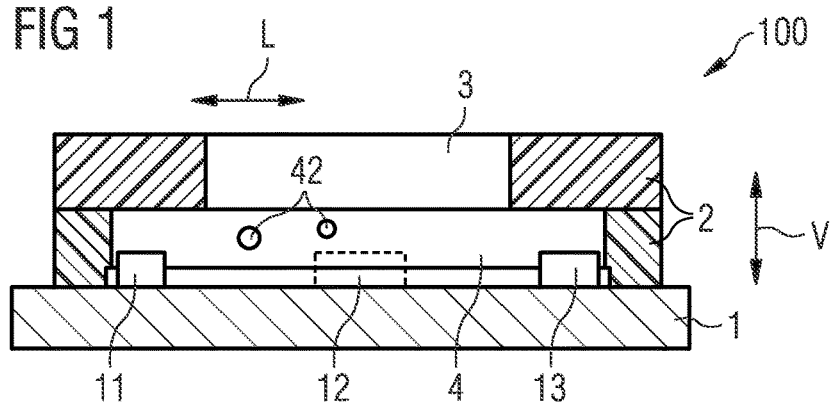
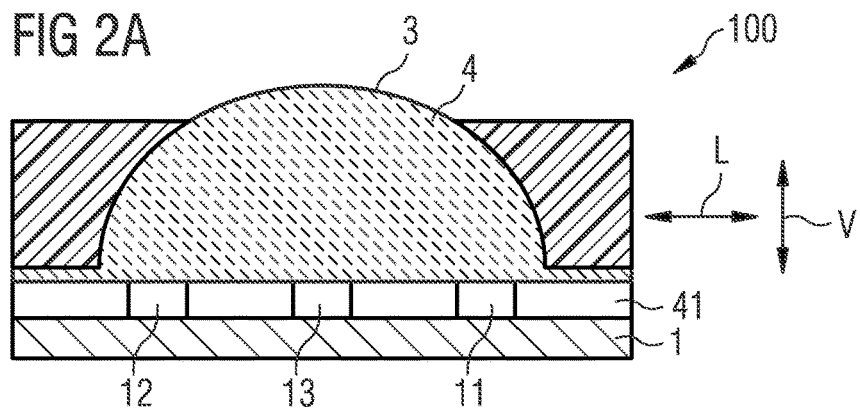
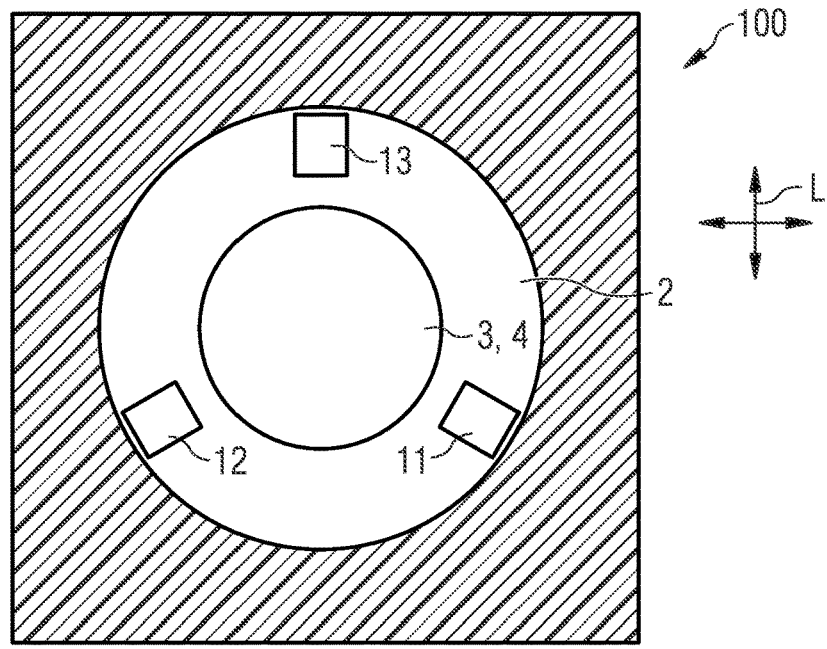

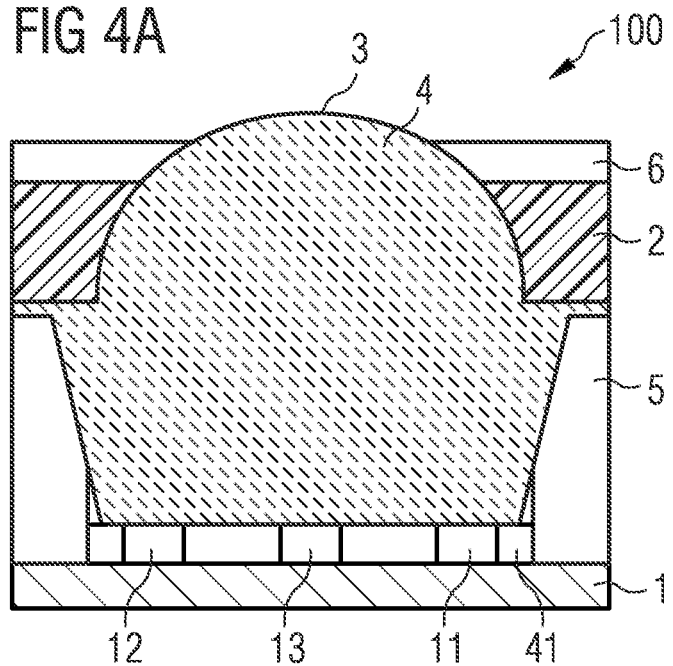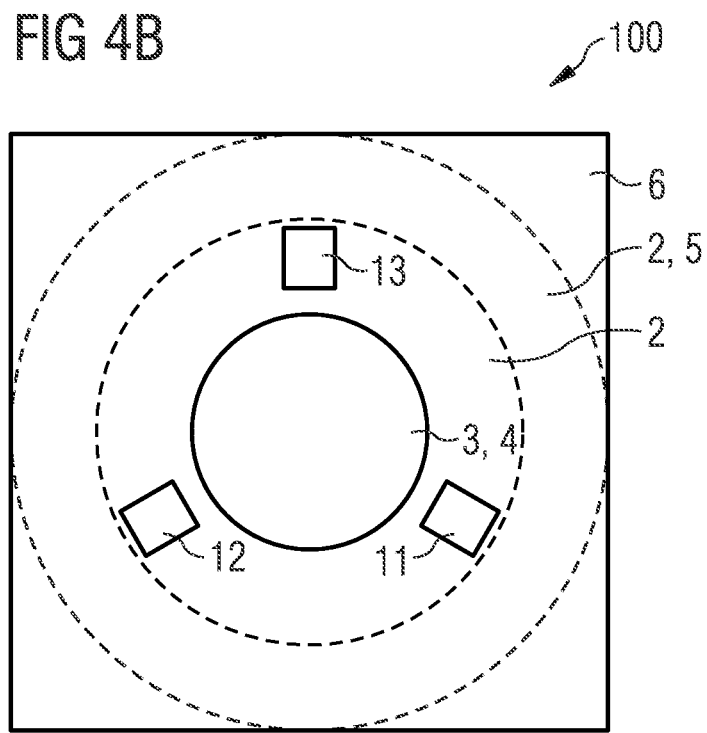

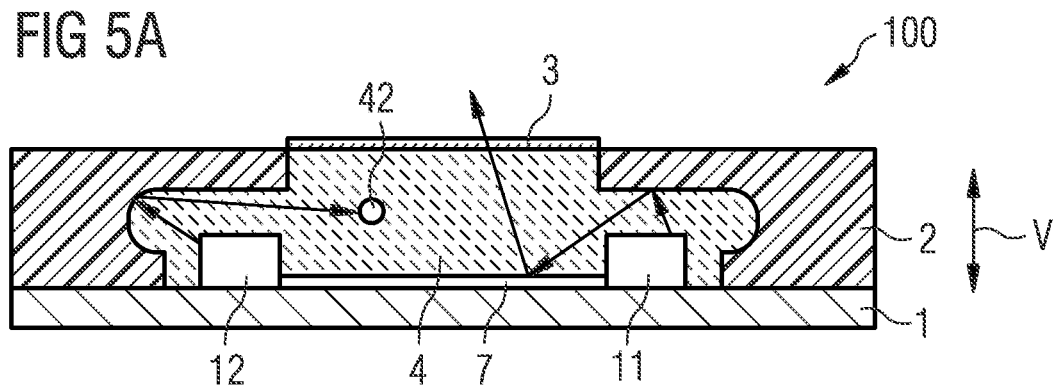
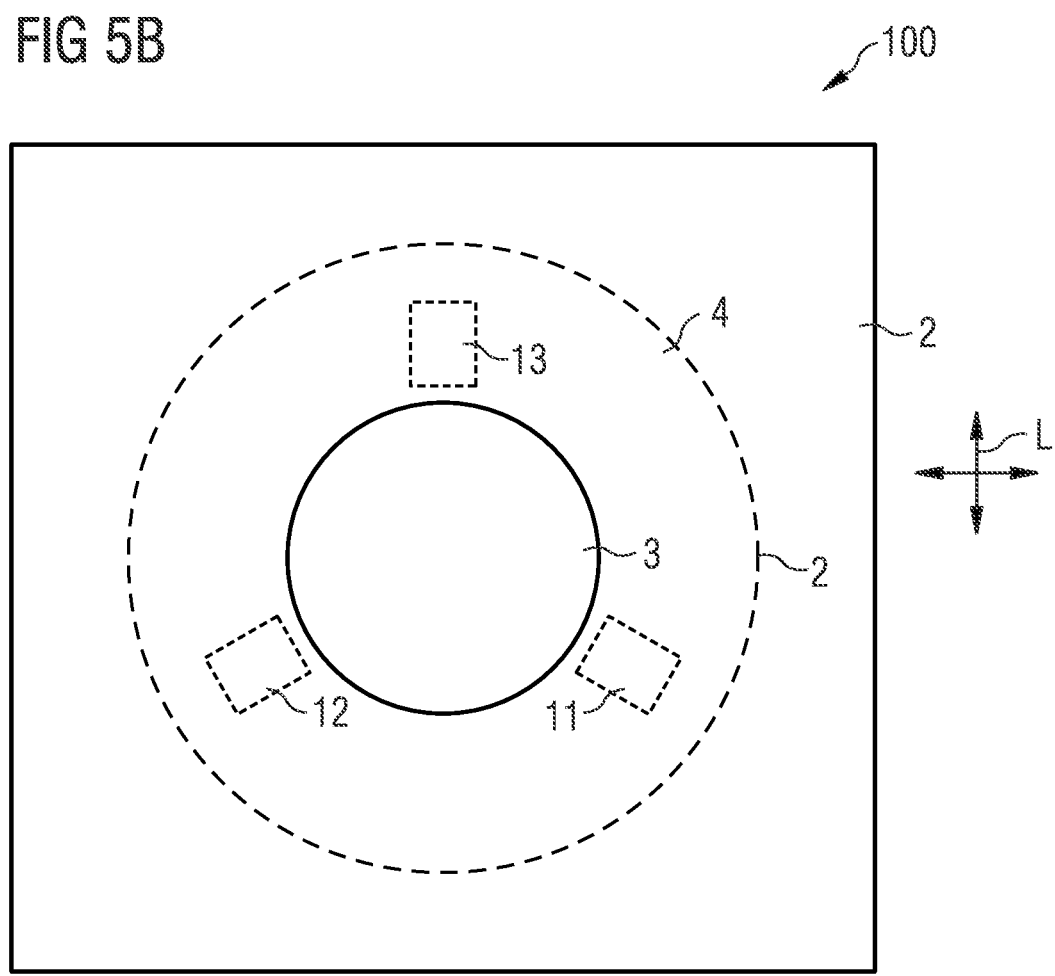

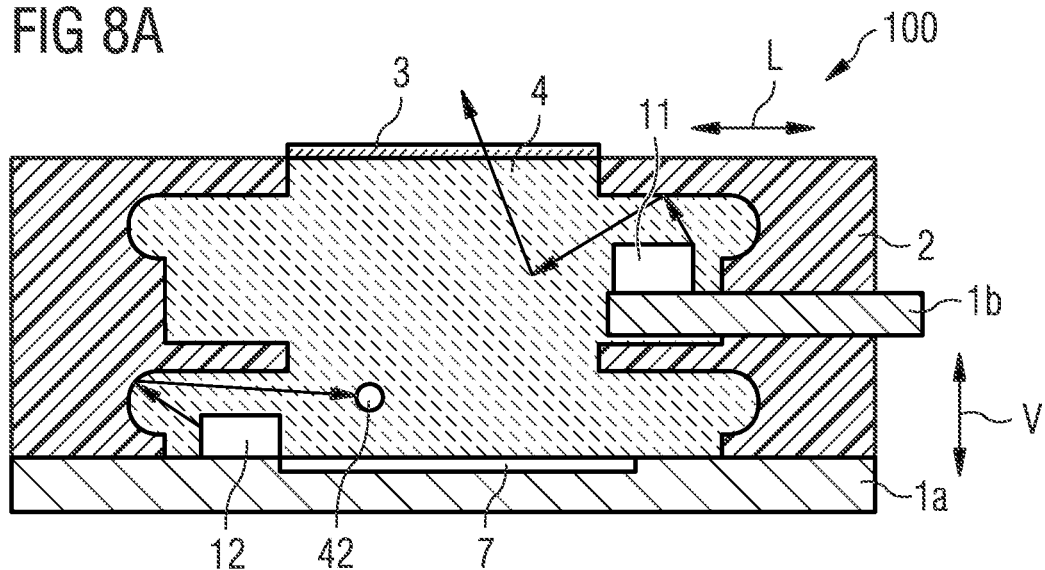
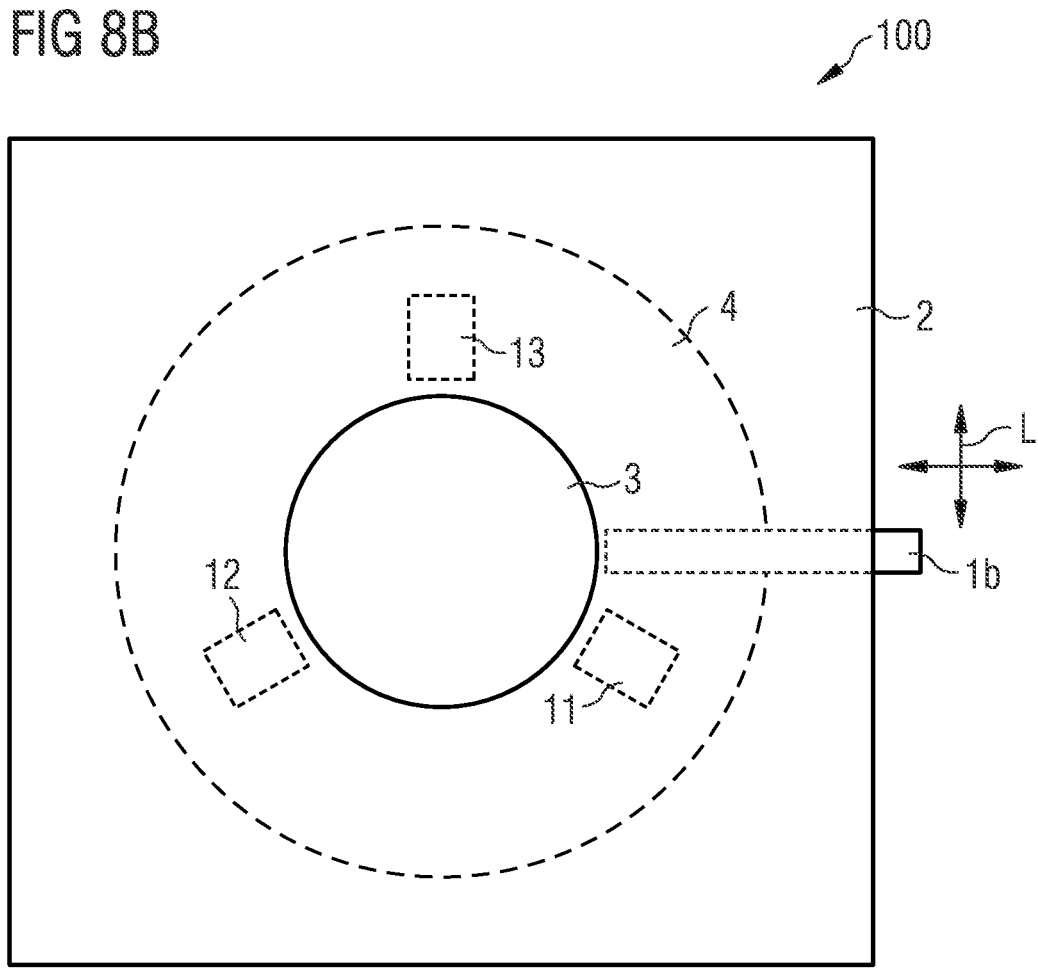

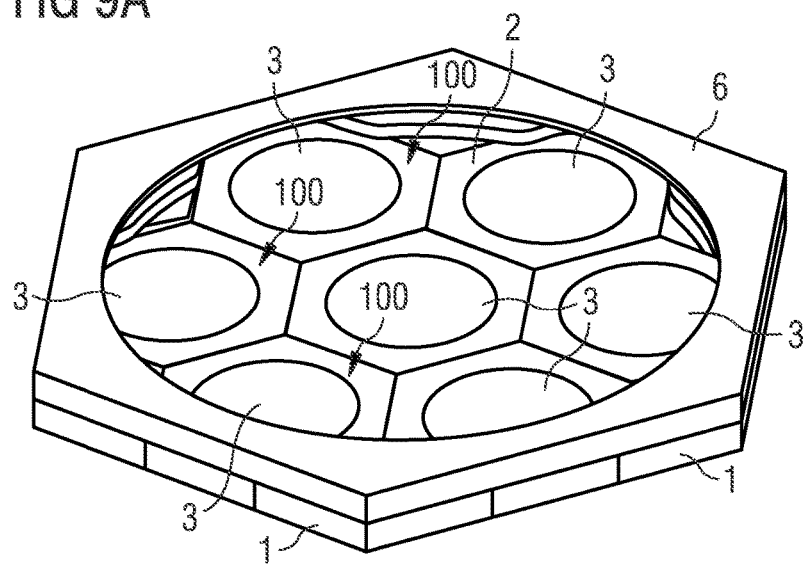
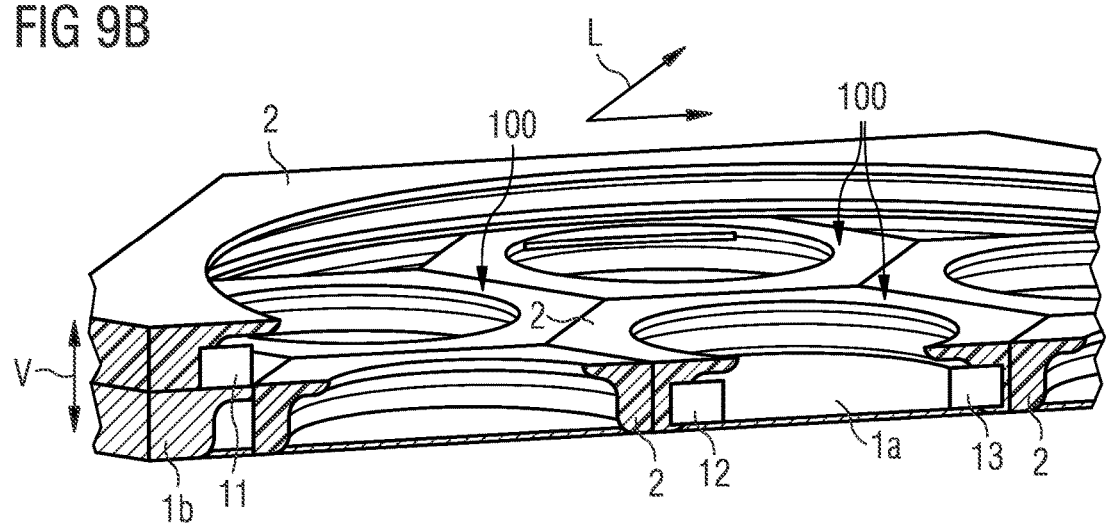

LIGHT-EMITTING DIODE AND LIGHTING MODULE

CROSS-REFERENCE TO RELATED APPLICATIONS

This application claims the benefit of German patent application 10 2016 108 692.4, filed on May 11, 2016, which application is hereby incorporated herein by reference.

TECHNICAL FIELD

A light-emitting diode and a lighting module are defined.

BACKGROUND

The specification WO 2013/045353 A1 describes a light-emitting diode.

A problem to be solved is to define a light-emitting diode which has an especially uniform emission pattern. A further problem to be solved is to define a light-emitting diode in which light of different colors is mixed especially uniformly before the light exits. A further problem to be solved is to define a lighting module having a multiplicity of such light-emitting diodes which is of especially compact construction.

SUMMARY

Embodiments of a light-emitting diode are provided. The light-emitting diode emits light during operation. The light can be, for example, colored light or white light. In particular, the light of the light-emitting diode can be mixed light which is composed of light of at least two different colors.

According to at least one embodiment of the light-emitting diode, the light-emitting diode comprises a light-emitting diode chip. Preferably the light-emitting diode comprises at least two or more light-emitting diode chips. The light-emitting diode can especially comprise light-emitting diode chips which emit light of different colors from one another during operation. For example, it is possible for the light-emitting diode to comprise a light-emitting diode chip that emits green light and a light-emitting diode chip that emits red light and also a light-emitting diode chip that emits blue light. Furthermore, it is possible for the light-emitting diode to comprise a light-emitting diode chip that emits yellowish-green light, so-called mint-colored light, during operation and a light-emitting diode chip that emits red light during operation.

For example, the light-emitting diode can comprise a light-emitting diode chip the light of which can mix to form white light. The white light can be, for example, white light having a high color temperature or having a low color temperature.

According to at least one embodiment of the light-emitting diode, the light-emitting diode comprises a first optical element, which is reflective for the light generated by the at least one light-emitting diode chip during operation. In particular, the first optical element is constructed so as to be reflective for the light of all light-emitting diode chips of the light-emitting diode. The reflectivity of the first optical element for the light of each light-emitting diode is preferably at least 50%. That is to say, at least 50% of the incident light is reflected by the first optical element. In particular, it is possible for the reflectivity of the first optical element for the light emitted by the at least one light-emitting diode chip to be at least 75%, especially at least 90%.

For that purpose the first optical element can be formed, for example, by an enveloping body which comprises a matrix material into which particles of a radiation-scattering and/or a radiation-reflecting material have been incorporated. For example, the first optical element is formed with a low-refractive-index silicone into which particles of titanium dioxide have been incorporated. Furthermore, it is possible for the first optical element to be formed by a reflective foil or by a reflective layer. The reflective foil or the reflective layer can comprise, for example, a reflective metal, such as aluminum or silver, or can consist of one of those materials.

The first optical element is arranged relative to the at least one light-emitting diode chip in such a way that at least a portion of the light emitted by the at least one light-emitting diode chip during operation is incident on the first optical element and is reflected thereby.

According to at least one embodiment of the light-emitting diode, the first optical element completely covers at least one of the light-emitting diode chips of the light-emitting diode in a plan view. That is to say, in a plan view onto the light-emitting diode, for example, in a main viewing direction running perpendicularly to a main extension plane of the light-emitting diode, at least one of the light-emitting diode chips is completely covered by the first optical element. In other words, in plan view the covered light-emitting diode chip is discernible only through the first optical element or, for the case where the first optical element is opaque to light, this light-emitting diode chip is not visible in plan view.

The first optical element completely overlaps the at least one covered light-emitting diode chip in lateral directions and extends, for example, beyond the covered light-emitting diode chip in the lateral directions. In a vertical direction the first optical element can be spaced apart from the light-emitting diode chip. The lateral directions are those directions which run parallel to a main extension plane of the light-emitting diode. The vertical direction runs perpendicularly to the main extension plane and therefore perpendicularly to the lateral directions. In addition, the first optical element can in places also laterally surround the covered light-emitting diode chip. For example, the light-emitting diode chip is completely surrounded on one of its side faces, especially on two or three of its side faces, by the first optical element, which can be arranged spaced apart from the surrounded side faces. In other words, the first optical element can form, for example, an overhang or a cavity in which the covered light-emitting diode chip is arranged.

According to at least one embodiment, a light-emitting diode is defined having at least one light-emitting diode chip, and a first optical element, which is reflective for the light generated by the at least one light-emitting diode chip during operation, wherein the first optical element completely covers at least one of the light-emitting diode chips in a plan view.

In the case of light-emitting diodes having a plurality of light-emitting diode chips of different colors, the light of which is to be mixed, for example, to form white light, that is to say, for example, in the case of what are known as RGB light-emitting diodes, color fringes often occur as a result of the different spatial placement of the light-emitting diode chips in the housing of the light-emitting diode. For light-mixing and an imaging of the light generated by the light-emitting diode chips during operation, complex optical systems are therefore often necessary.

A light-emitting diode described herein now makes use inter alia of the idea of directing or guiding the light of the at least one light-emitting diode chip of the light-emitting diode onto a spatially narrowly limited region. In this spatially narrowly limited region, the mixing space, the light can then be mixed, for example, with the aid of scattering particles and reflecting surfaces, that is to say inter alia by the first optical element, and coupled out of the light-emitting diode. The light generated by the light-emitting diode chips is coupled out as completely as possible via this mixing space.

It has surprisingly been found that an especially homogeneous emission pattern can be achieved if at least one of the light-emitting diode chips is, in a plan view, completely covered by the reflectively constructed first optical element, so that, for example, no light is able to leave the light-emitting diode directly in the main emission direction of the light-emitting diode chip, but such light undergoes at least one reflection at the first optical element. It is true that this can lead to a slight deterioration in the efficiency of the light-emitting diode, because each reflection at the first optical element is associated with an, albeit slight, absorption of light. It has been found, however, that this perceived disadvantage is outweighed by the improvement in the homogeneity of the emission pattern or an intermixing of the light of a plurality of light-emitting diode chips in the light-emitting diode, which leads to an especially high color homogeneity of the mixed light.

An enhanced homogeneity of the light emission pattern has the result, for example, that the luminance over the emission surface of the light-emitting diode is especially uniform and/or the color location over the emission surface of the light-emitting diode is especially uniform and/or the color location and/or the luminance in the far-field are especially uniform.

According to at least one embodiment of the light-emitting diode, the first optical element completely covers all light-emitting diode chips in plan view. That is to say, especially for the case where the light-emitting diode comprises two or more light-emitting diode chips, all light-emitting diode chips are completely covered by the first optical element in plan view. That is to say, none of the light-emitting diode chips can emit the light directly, for example, in its main emission direction, but at least that light in the main emission direction can undergo at least one reflection. Furthermore, none of the light-emitting diode chips is directly visible in plan view onto the light-emitting diode, but only through the reflective first optical element for the case where the latter is radiation-transmissive, or not at all for the case where the first optical element is radiation-opaque.

According to at least one embodiment of the light-emitting diode, the first optical element is opaque to the light generated by the at least one light-emitting diode chip during operation. That is to say, none of the incident light passes through the first optical element. All the light is reflected or absorbed at the first optical element. In particular, it is therefore possible for none of the light-emitting diode chips of the light-emitting diode to be visible from the outside in plan view onto the light-emitting diode. All light-emitting diode chips of the light-emitting diode are then covered by the first optical element and are not directly visible. This has the result that the light emitted by the light-emitting diode chips during operation undergoes especially good intermixing at a light exit surface of the light-emitting diode, since none of the light of the light-emitting diode chips is able to leave the light-emitting diode by a direct route, that is to say without reflection or scattering.

According to at least one embodiment of the light-emitting diode, the light-emitting diode comprises at least one enveloping body which is transmissive to the light generated by the at least one light-emitting diode chip during operation, wherein the enveloping body abuts all light-emitting diode chips of the light-emitting diode. The enveloping body can be configured to be pellucidly transparent. Furthermore, it is possible for the enveloping body to be formed with a base material into which particles of a radiation-scattering and/or a radiation-reflecting and/or a radiation-converting material have been incorporated.

For example, the enveloping body can be formed with a high-refractive-index silicone into which particles of a diffuser material, which can be formed, for example, with silicon dioxide or titanium dioxide, have been incorporated. The enveloping body can have a certain reflectivity for the light of the light-emitting diode chips, which is lower, however, than the reflectivity of the first optical element. For example, the reflectivity of the enveloping body as a result of the incorporated particles is at most 10%.

The enveloping body especially abuts all light-emitting diode chips of the light-emitting diode; it especially abuts the light-emitting diode chips directly. In this way it is possible for the light-emitting diode chips of the light-emitting diode to couple their light directly or indirectly into the enveloping body. As a result of scattering in the enveloping body and/or as a result of reflection at the first optical element, especially good intermixing of the light of the light-emitting diode chips then takes place. The enveloping body accordingly contributes to the homogenization of the emission pattern and especially to improved color mixing.

According to at least one embodiment of the light-emitting diode, the first optical element covers the enveloping body in places in plan view. That is to say, the enveloping body can also be covered by the first optical element, so that in the covered regions the light cannot pass directly out of the enveloping body to the outside, but is reflected at the first optical element. The enveloping body can in places directly abut the first optical element. For example, the first optical element can cover the enveloping body in frame-like or ring-like manner. The first optical element then contributes to limiting a light exit surface of the light-emitting diode to a small region which is not covered by the first optical element. This increases the luminance at the exit surface of the light-emitting diode and improves the color homogeneity at the exit surface of the light-emitting diode.

According to at least one embodiment of the light-emitting diode, the enveloping body is constructed for mixing the light generated by the light-emitting diode chips during operation. For that purpose the enveloping body comprises, for example, the said particles of a diffuser material which are constructed for scattering and/or reflecting the light of the light generated by the light-emitting diode chips of the light-emitting diode during operation. As a result of the fact that the light generated by the at least one light-emitting diode chip during operation is reflected by the optical element, the distance travelled by the light before it leaves the light-emitting diode is increased. The light is therefore present in the enveloping body over a longer path than would be the case without the first optical element, so that a relatively low density of diffuser material in the enveloping body can also provide for good intermixing of the light. For example, the density of the diffuser material in the enveloping body is at most 5% by weight, especially at most 2.5% by weight.

According to at least one embodiment of the light-emitting diode, the light-emitting diode comprises at least one light-emitting diode chip that emits blue light, at least one light-emitting diode chip that emits red light and at least one light-emitting diode chip that emits green light. In particular, it is possible for the light-emitting diode to comprise precisely one light-emitting diode chip that emits red light, precisely one light-emitting diode chip that emits green light and precisely one light-emitting diode chip that emits blue light. The light-emitting diode is then what is known as a RGB light-emitting diode. Preferably all light-emitting diode chips are covered by the first optical element in plan view.

According to at least one embodiment of the light-emitting diode, the light-emitting diode comprises a second optical element, which is constructed for optically influencing the light generated by all light-emitting diode chips during operation. The second optical element can be a Fresnel lens or a Fresnel-like lens or a surface having a lens-like curve, for example, a surface of the enveloping body. For the case where the second optical element is a Fresnel lens or a Fresnel-like lens, the structures of the lens can likewise be incorporated into the enveloping body.

According to at least one embodiment of the light-emitting diode, the second optical element is constructed for influencing the light generated by all light-emitting diode chips during operation. In other words, the light of each light-emitting diode passes through the second optical element. For example, the outer surface of the second optical element forms the radiation exit surface of the light-emitting diode, so that light is able to leave the light-emitting diode exclusively through the second optical element. The second optical element can be provided, for example, for beam formation, and/or the second optical element, by virtue of its shaping, increases a probability of the escape of light from the light-emitting diode.

According to at least one embodiment of the light-emitting diode, the light-emitting diode comprises a cover or diaphragm which is opaque to the light generated by the light-emitting diode chips during operation, wherein the cover completely surrounds the second optical element in lateral directions. For example, the cover is formed from a radiation-reflecting or a radiation-absorbing material. The cover can be implemented, for example, in the form of a foil or layer which covers both the first optical element and the second optical element in places and can be in direct contact with both optical elements. For example, the cover can for that purpose be colored or black. The cover can in this way further reduce the size of the radiation exit surface of the light-emitting diode. Furthermore, as a result of the cover, a contrast between the radiation exit surface and the surrounding material is increased.

According to at least one embodiment of the light-emitting diode, the light-emitting diode comprises at least two light-emitting diode chips, and at least one of the light-emitting diode chips is arranged spaced apart in a vertical direction from at least one other of the light-emitting diode chips. The vertical direction is the direction perpendicular to the main extension direction of the light-emitting diode. In other words, the two light-emitting diode chips are arranged in different planes of the light-emitting diode. The different planes of the light-emitting diode can run at least in sections or wholly parallel to one another and be arranged one above the other in a vertical direction, transversely or perpendicularly to the planes. For example, the spacing between the two light-emitting diode chips is at least the height of one of the light-emitting diode chips. Both light-emitting diode chips can be covered by the first optical element. In other words, the light-emitting diode is provided with a layered arrangement of the light-emitting diode chips, wherein each of the light-emitting diode chips is covered, for example, by a portion of the first optical element, so that the light-emitting diode chips in different layers or planes are in each case arranged in a spatial cavity, for example, a toroidal or torus-like cavity, having reflective walls. The cavities are each formed at least partly by the first optical element.

The different layers or planes of the light-emitting diode are arranged one above the other in the vertical direction and can each be provided with the light-emitting diode chips of the light-emitting diode along a peripheral surface of the light-emitting diode. In this way the vertical packing density of light-emitting diode chips in the light-emitting diode can be increased, with the result that it is possible to reduce the base surface of the light-emitting diode as a whole. By means of the first optical element it can be ensured that light-emitting diodes from a lower plane cannot shine directly on light-emitting diodes from a higher plane, so that, for example, losses resulting from reabsorption in light-emitting diode chips are reduced.

Also defined is a lighting module. The lighting module comprises at least two light-emitting diodes described herein. That is to say, all the features described for the light-emitting diode are also described for the lighting module and vice versa. The light-emitting diodes in the lighting module are arranged one next to the other in the lateral directions and are mechanically connected to one another. For that purpose the light-emitting diodes in the lighting module can share, for example, at least one component. For example, they have a common carrier, or they are mechanically connected to one another by the first optical element and/or the second optical element.

According to at least one embodiment of the lighting module, each light-emitting diode has a hexagonal outline in plan view, wherein at least one of the light-emitting diodes abuts six similar light-emitting diodes in the lateral directions. In other words, in plan view the light-emitting diodes can have a hexagonal shape and can be arranged honeycomb-like one next to the other. By virtue of this arrangement there is realized an especially compact lighting module in which especially many light-emitting diodes can be arranged on a particularly small surface. To increase the luminance of the light generated by the lighting module, the light-emitting diodes can comprise light-emitting diode chips which are arranged spaced apart from one another in the vertical direction, wherein each plane of the light-emitting diodes comprises a portion of the first optical element and accordingly a reflector.

BRIEF DESCRIPTION OF THE DRAWINGS

The light-emitting diode described herein and the lighting module described herein are elucidated in detail below with reference to Figures and the associated exemplified embodiments.

Referring to the diagrammatic views of FIGS. 1, 2A, 2B, 3A, 3B, 4A, 4B, 5A, 5B, 6A, 6B, 7A, 7B, 8A, 8B, exemplified embodiments of light-emitting diodes described herein are elucidated in detail In conjunction with the diagrammatic views of FIGS. 9A, 9B, 10A, 10B, exemplified embodiments of lighting modules described herein are elucidated in detail.

In the Figures, elements that are identical or similar or have identical action are denoted by the same reference numerals. The Figures and the relative sizes of the elements illustrated in the Figures to one another should not be regarded as to scale; rather, the size of individual elements

DETAILED DESCRIPTION OF ILLUSTRATIVE EMBODIMENTS

Figure 3A:
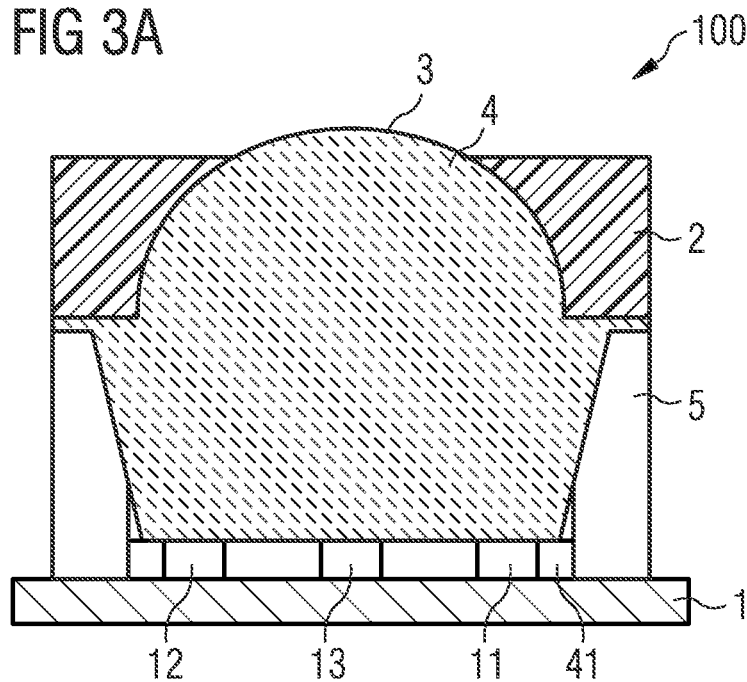

FIG. 1 shows a diagrammatic sectional view of a first exemplified embodiment of a light-emitting diode 100 described herein. The light-emitting diode 100 comprises a carrier 1. The carrier can be, for example, a connection carrier, such as a circuit board, a printed circuit board, a metal core board, a connection carrier having a ceramic base body and electrical connection points, or a metal lead frame which is embedded in a plastics material.

The light-emitting diode chips 11, 12, 13 are mechanically attached and electrically conductively connected on the top of the carrier 1. The light-emitting diode chips 11, 12, 13 are, for example, a light-emitting diode chip 11 that emits blue light, a light-emitting diode chip 12 that emits red light and a light-emitting diode chip 13 that emits green light.

All the light-emitting diode chips 11, 12, 13 are covered by a first optical element 2 in plan view. The first optical element 2 is constructed so as to be reflective for the light emitted by the light-emitting diode chips 11, 12, 13 during operation. The first optical element 2 is, for example, of frame-like or ring-like construction and the light-emitting diode chips 11, 12, 13 are arranged along the frame or the ring in such a way that they are completely covered by the first optical element 2 in the vertical direction L, so that they are not visible in plan view onto the light-emitting diode, for example, in a viewing direction running parallel to the vertical direction V.

The light-emitting diode chips 11, 12, 13 can be enveloped by an enveloping body 4 which can, for example, be constructed so as to be radiation-scattering. For that purpose the enveloping body 4 can be a potting body having, for example, a high-refractive-index silicone into which light-scattering or light-reflecting particles 42 of a diffuser, such as, for example, titanium dioxide, have been incorporated.

In the exemplified embodiment of FIG. 1 it is also possible, however, to omit the enveloping body 4. The light-emitting diode chips 11, 12, 13 are then, for example, in contact with air.

Furthermore, the light-emitting diode of FIG. 1 can comprise a second optical element 3, the outer surface of which remote from the carrier 1 forms the single radiation exit surface of the light-emitting diode. The second optical element 3 is surrounded in frame-like or ring-like manner by the first optical element 2. The second optical element 3 can be, for example, a lens or a scattering body for scattering the light passing through.

The first optical element 2 is especially constructed so as to be radiation-opaque and has a reflectivity for the light emitted by the light-emitting diode chips 11, 12, 13 of at least 90%. The diameter of the light-emitting diode in the lateral directions L can be, for example, at least 1 cm and at most 5 cm. The vertical extent in the vertical direction V is, for example, at most 2 cm, especially at most 1 cm.

In conjunction with the diagrammatic side view of FIG. 2A and the diagrammatic plan view of FIG. 2B, a further exemplified embodiment of a light-emitting diode described herein is elucidated in detail. In this exemplified embodiment the light-emitting diode comprises an enveloping body 4 which comprises a high-refractive-index silicone and particles of a diffuser. The enveloping body 4 in places directly abuts the light-emitting diode chips 11, 12, 13. The light-emitting diode chips 11, 12, 13 can be mounted in such a way that their main emission surface runs transversely or perpendicularly to the mounting surface.

The light-emitting diode chips 11, 12, 13 are surrounded by a further enveloping body 41 which, on the side remote from the carrier 1, can terminate flush with the light-emitting diode chips 11, 12, 13. The further enveloping body 41 is constructed so as to be, for example, radiation-reflective and has for that purpose, for example, titanium dioxide which can be incorporated into a matrix material such as, for example, a relatively low-refractive-index silicone. The light-emitting diode chips 11, 12, 13 are arranged at the edge of the light-emitting diode along a ring below the first optical element 2, so that they are covered by the latter in plan view onto the light-emitting diode (see in this connection especially FIG. 2B). The light-emitting diode chips 11, 12, 13, together with the further enveloping body 41, can also be implemented in the form of what are known as Sidelooker-LEDs. That is to say, the light-emitting diode chips can be incorporated in the form of finished, side-emitting light-emitting diodes into the light-emitting diode described herein.

In the case of the light-emitting diode 100, the light emitted by the light-emitting diode chips 11, 12, 13 during operation is guided by the reflective surfaces of the first optical element 2 into a spatially narrowly limited region in the centre of the light-emitting diode where the enveloping body 4 has, for example, a convexly curved region which extends out of the first optical element 2 and forms a second optical element 3, in this case a lens-like structure.

In the enveloping body 4 there takes place, for example, as a result of the diffuser, an intermixing of the light of the differently colored light-emitting diode chips 11, 12, 13. The light then exits exclusively through the second optical element 3, that is to say the region of the outer surface of the enveloping body 4 not covered by the first optical element 2. It has been found that by the selection of a high-refractive-index base material for the enveloping body 4 and a low-refractive-index base material for the first optical element 2 it is possible to increase the efficiency of the component. The first optical element 2 and the further enveloping body 41 can be produced, for example, by casting. The first enveloping body 4 with the second optical element 3 is produced, for example, by molding.

Figure 3B:
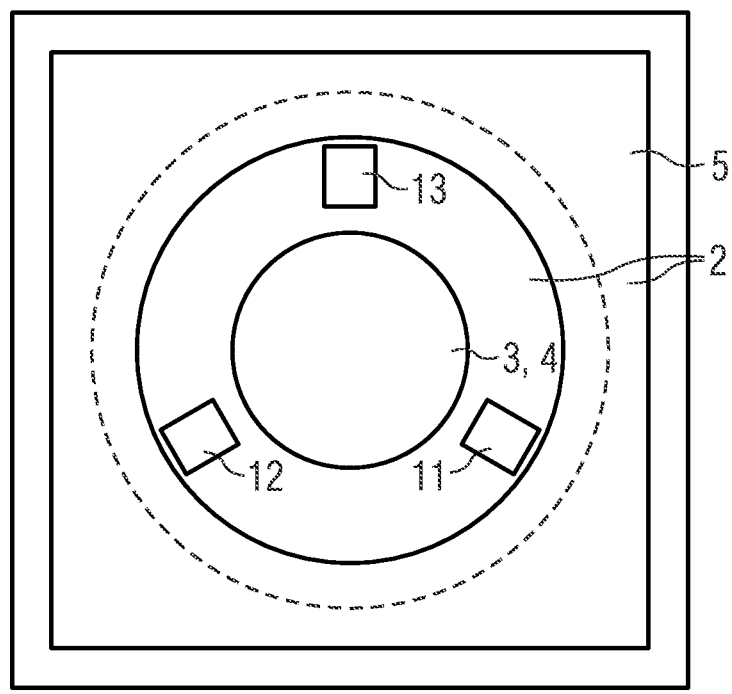

In conjunction with the diagrammatic side view of FIG. 3A and the diagrammatic plan view of FIG. 3B, a further exemplified embodiment of a light-emitting diode described herein is elucidated in detail.

Unlike the exemplified embodiments described above, the light-emitting diode in the exemplified embodiment of FIGS. 3A and 3B has a housing body 5 as additional element. The housing body 5 is connected, for example, to the carrier 1, which can comprise a lead frame, and forms therewith a housing for the light-emitting diode chips 11, 12, 13. The housing body 5 can be constructed so as to be reflective. The housing body 5 directly abuts the enveloping body 4 and is overlapped by the latter in places. With the housing body 5 it is possible to collimate the light emitted by the light-emitting diode chips 11, 12, 13 and in that way achieve an especially high luminance at the light exit surface of the light-emitting diode.

In conjunction with the diagrammatic side view of FIG. 4A and the diagrammatic plan view of FIG. 4B, a further exemplified embodiment of a light-emitting diode described herein is described. Unlike the preceding exemplified embodiments, the light-emitting diode in this exemplified embodiment comprises a diaphragm or cover 6, which is, for example, a blackened layer which is in places in direct contact with the first optical element 2 and the enveloping body 4. The reflectivity of the second optical element 3 can be covered from the outside by the cover 6, so that a contrast between the light exit surface in the region of the second optical element 3 and its surroundings is increased. The cover 6 encompasses the second optical element 3 and accordingly the light exit surface of the light-emitting diode in ring-like or frame-like manner. Such a cover 6 can be used for all exemplified embodiments of light-emitting diodes described herein.

In conjunction with the diagrammatic side view of FIG. 5A and the diagrammatic plan view of FIG. 5B there is illustrated a further exemplified embodiment of a light-emitting diode described herein in which the light-emitting diode can be of especially flat configuration. The second optical element 3 in this exemplified embodiment is constructed in the form of a Fresnel optical system which directly abuts the enveloping body 4 or is structured in the outer surface thereof. The first optical element 2 forms a reflective plastics ring which completely surrounds the second optical element 3 in the lateral directions L. Furthermore, the light-emitting diode comprises a mirror 7 which is arranged between the light-emitting diode chips 11, 12, 13 on an underside of the enveloping body 4 remote from the second optical element 3. The mirror 7 increases the light escape probability and can be used for all exemplified embodiments of light-emitting diodes described herein. As a result of the second optical element 3, which is constructed in the form of a Fresnel lens, the embodiment of the light-emitting diode described in conjunction with FIGS. 5A and 5B makes it possible to realize an especially flat light-emitting diode which has an especially small extent in the vertical directions V.

Figure 6A:
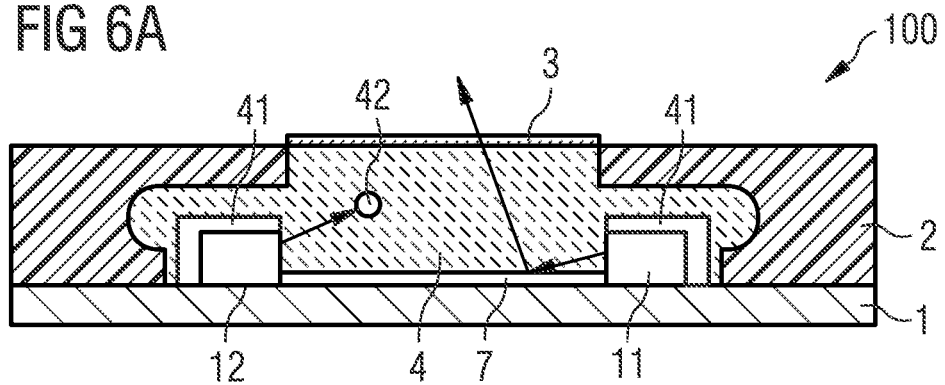
Figure 6B:
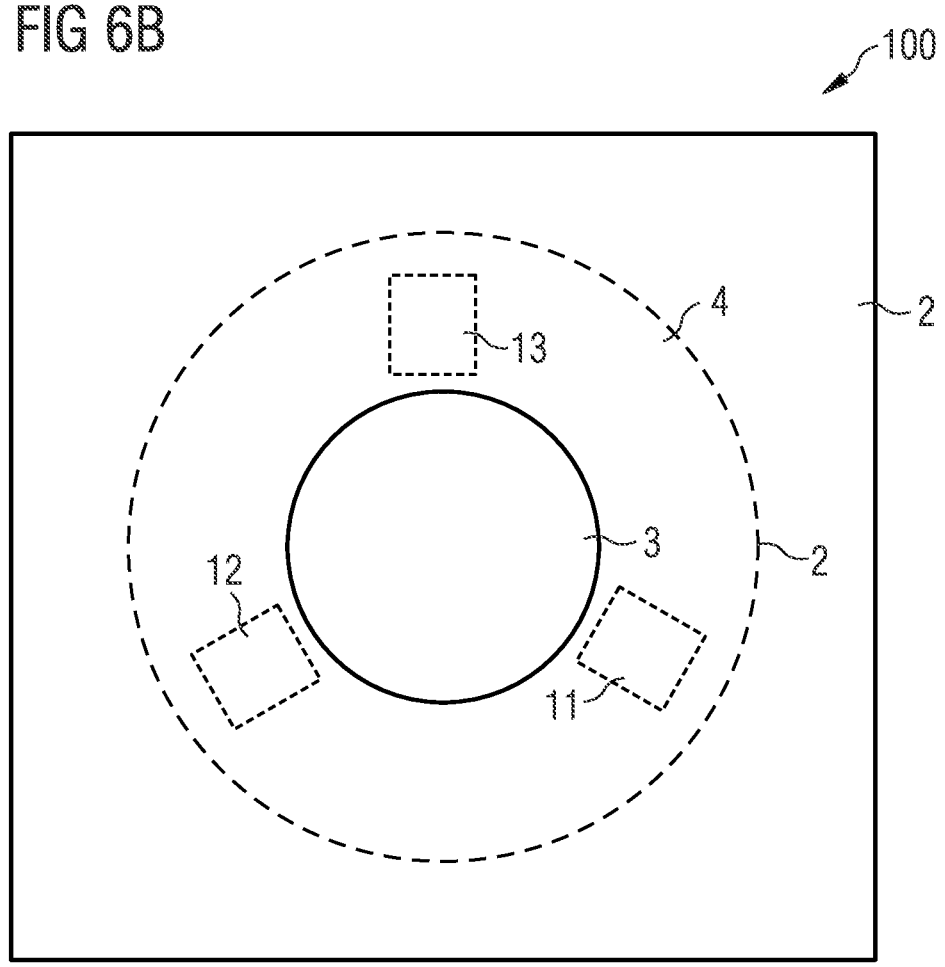

In conjunction with the diagrammatic side view of FIG. 6A and the diagrammatic plan view of FIG. 6B, a further exemplified embodiment of a light-emitting diode described herein is elucidated in detail. Unlike the exemplified embodiment of FIGS. 5A and 5B, in this exemplified embodiment in addition a further enveloping body 41 is mounted around each of the light-emitting diode chips 11, 12, 13. The further enveloping body 41 is formed, for example, with a radiation-reflecting material which can surround the semiconductor chips in such a way that only a side face of each semiconductor chip 11, 12, 13 directly abuts the enveloping body 4.

Figure 7A:
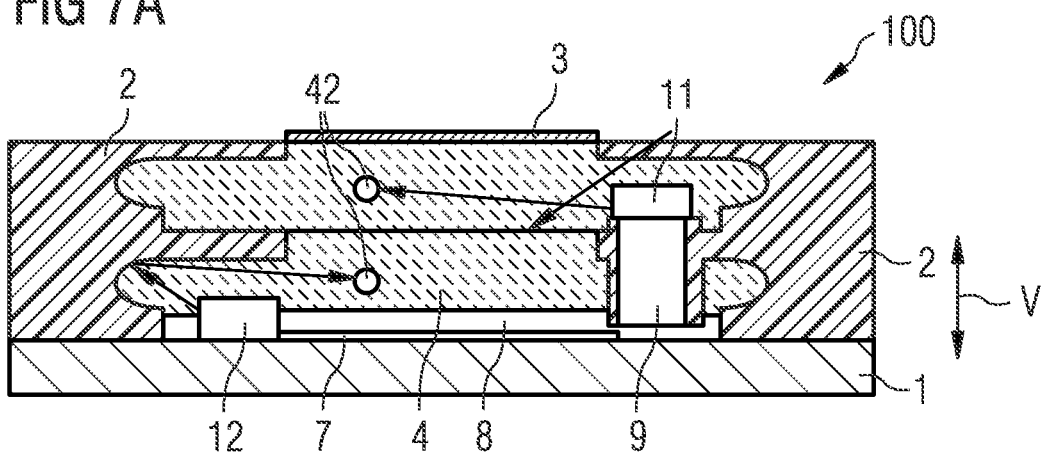
Figure 7B:
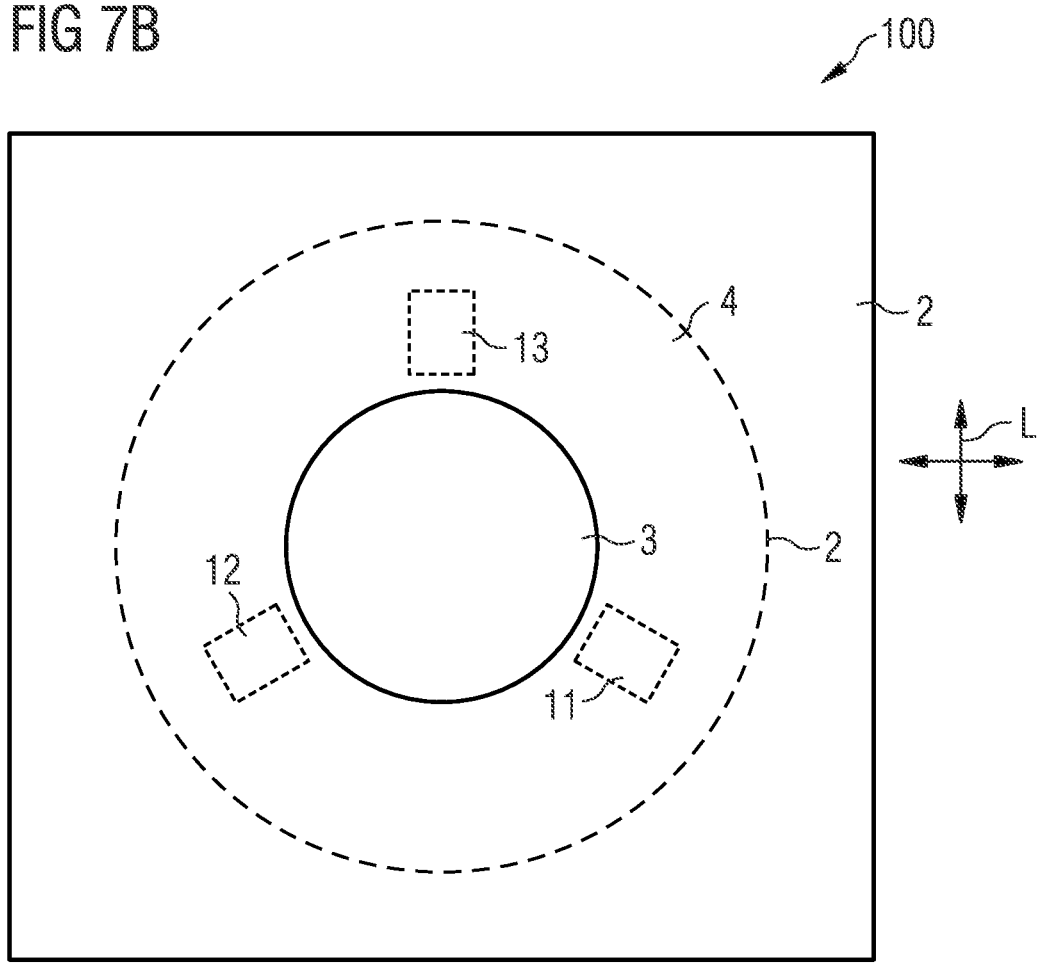

In conjunction with the diagrammatic views of FIGS. 7A and 7B, a further exemplified embodiment of a light-emitting diode described herein is elucidated in detail. In this exemplified embodiment the light-emitting diode chips 11, 12, 13 are at least partly arranged spaced apart from one another in the vertical direction V. For example, the light-emitting diode chip 11 that emits blue light is arranged in an elevated position relative to the light-emitting diode chip 12 that emits red light and the light-emitting diode chip 13 that emits green light. It can be in electrically conductive connection with conductor tracks 8 of the carrier 1, for example, by means of a through-via 9 which can extend through a portion of the enveloping body 4. The light-emitting diode chips 11, 12, 13 are each surrounded in places by the enveloping body 4 and covered by the first optical element 2. The light-emitting diode 100 therefore comprises color mixing chambers delimited laterally by the first optical element 2 and stacked one on top of the other, in which chambers the light generated by the light-emitting diode chips 11, 12, 13 during operation is able to mix. The design of FIGS. 7A and 7B allows the light-emitting diode to be of especially small construction in the lateral directions L.

In conjunction with the diagrammatic views of FIGS. 8A and 8B, an exemplified embodiment of the light-emitting diode 100 is described in which, in modification of the exemplified embodiment of FIGS. 7A and 7B, there is no through-via 9; rather, the light-emitting diode chip 11 that emits blue light, for example, is mounted on a carrier 1*b* which is arranged spaced apart in the vertical direction V from the carrier 1*a*. This allows simplified contacting of the light-emitting diode chip 11 mounted in the plane of the second carrier 1*b*.

In conjunction with the diagrammatic perspective views of FIGS. 9A and 9B, exemplified embodiments of a lighting module described herein are elucidated in detail. The lighting module comprises a multiplicity of light-emitting diodes 100, which can each have a hexagonal outline. The lighting module itself has a hexagonal outline and is composed, for example, of seven light-emitting diodes 100 described herein. It is possible, as shown in FIG. 9A, to use light-emitting diodes in which all the light-emitting diode chips 11, 12, 13 are arranged in one plane, or, as shown in FIG. 9B, to use light-emitting diodes 100 in which at least one of the light-emitting diode chips 11 is arranged spaced apart in the vertical direction V from the other light-emitting diode chips 12, 13.

The hexagonal shape of the module proves to be especially advantageous for a compact spatial arrangement of the lighting module. The hexagonal lighting modules can be set very close to one another, with the result that an especially large luminescent surface can be produced.

Figure 10A:
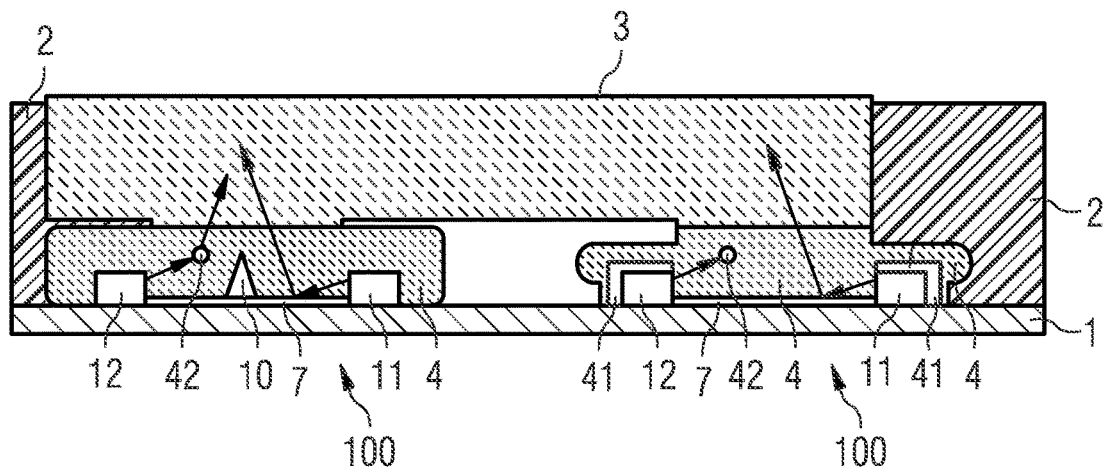
Figure 10B:
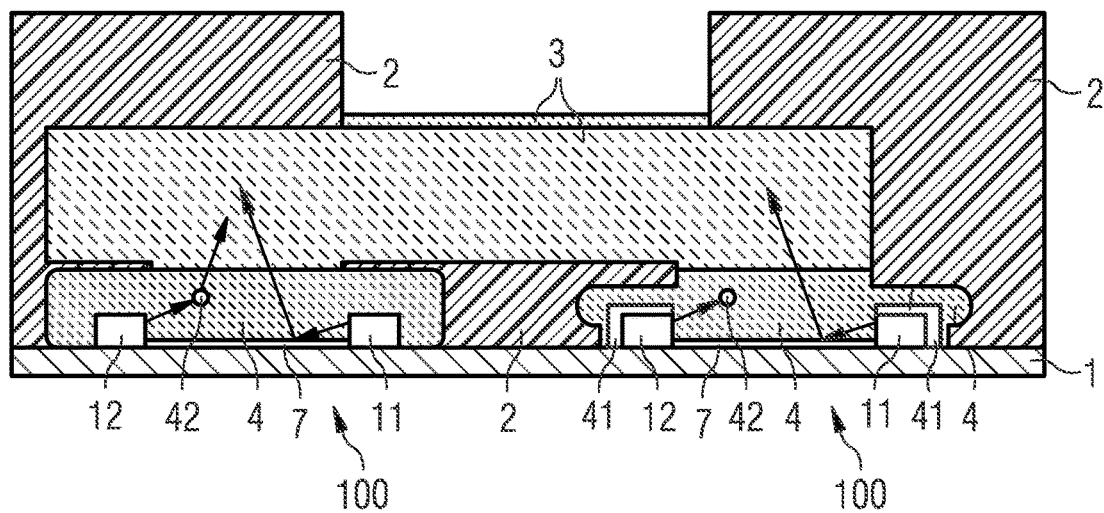

In conjunction with the diagrammatic sectional views of FIGS. 10A and 10B there are elucidated in detail exemplified embodiments of a lighting module described herein in which different kinds of light-emitting diodes 100 described herein are used in a lighting module. The light-emitting diodes 100 have a common carrier 1 and a common second optical element 3. Furthermore, the light-emitting diodes 100 can also share the first optical element 2 which is constructed so as to be coherent over the whole lighting module.

In conjunction with FIG. 10A, a lighting module is illustrated in which on the left-hand side of the light-emitting diode 100 there is a reflector 10 as further outcoupling structure, which serves as additive outcoupling structure for modifying the emission pattern of the light emitted by the light-emitting diode during operation.

The description of the invention with reference to the exemplified embodiments does not limit the invention thereto; rather, the invention encompasses any novel feature and any combination of features, including in particular any combination of features in the patent claims, even if that feature or that combination is not itself explicitly defined in the patent claims or exemplified embodiments.

What is claimed is:

1. A light-emitting diode comprising:
   at least one light-emitting diode chip; and
   a first optical element, which is reflective for light generated by the at least one light-emitting diode chip during operation,
   wherein the first optical element completely covers at least one of the at least one light-emitting diode chip in a plan view;
   wherein the first optical element completely covers at least one of the at least one light-emitting diode chip in a view from a radiation exit surface of the light-emitting diode; and wherein the reflectivity of the first optical element for light emitted by the at least one light-emitting diode chip is at least 75%.

2. The light-emitting diode according to claim 1, wherein the first optical element completely covers all light-emitting diode chips in the plan view.

3. The light-emitting diode according to claim 1, wherein the first optical element is opaque to the light generated by the at least one light-emitting diode chip during operation.

4. The light-emitting diode according to claim 1, further comprising an enveloping body, which is transmissive to the light generated by the at least one light-emitting diode chip during operation, wherein the enveloping body abuts all light-emitting diode chips.

5. The light-emitting diode according to claim 4, wherein the first optical element covers the enveloping body in places in the plan view.

6. The light-emitting diode according to claim 4, wherein the first optical element abuts the enveloping body in places.

7. The light-emitting diode according to claim 4, wherein the enveloping body is constructed for mixing the light generated by the light-emitting diode chips during operation.

8. The light-emitting diode according to claim 1, wherein the at least one light-emitting diode chip comprises at least one light-emitting diode that emits blue light, at least one light-emitting diode chip that emits red light and at least one light-emitting diode chip that emits green light.

9. The light-emitting diode according to claim 1, further comprising a second optical element, which is constructed for optically influencing the light generated by all light-emitting diode chips during operation.

10. The light-emitting diode according to claim 9, wherein the light generated by the light-emitting diode chips during operation leaves the light-emitting diode exclusively through the second optical element.

11. The light-emitting diode according to claim 1, further comprising a cover, which is opaque to the light generated by the at least one light-emitting diode chip during operation, wherein the cover completely surrounds a second optical element in lateral directions.

12. The light-emitting diode according to claim 1, wherein the light-emitting diode comprises at least two of the light-emitting diode chips, and at least one of the light-emitting diode chips is arranged spaced apart in a vertical direction from at least one other of the light-emitting diode chips.

13. The light-emitting diode according to claim 1, further comprising an enveloping body which is transmissive to the light generated by the light-emitting diode chips during operation,
wherein the enveloping body abuts all light-emitting diode chips of the light-emitting diode,
wherein the enveloping body is formed with a base material into which particles of a radiation-scattering and/or a radiation-reflecting material have been incorporated so that the enveloping body is constructed for mixing the light generated by the light-emitting diode chips during operation,
wherein the at least one light-emitting diode chip comprises at least one light-emitting diode chip that emits blue light, at least one light-emitting diode chip that emits red light and at least one light-emitting diode chip that emits green light, and
wherein at least one of the light-emitting diode chips is arranged spaced apart in a vertical direction from at least one other of the light-emitting diode chips.

14. The light-emitting diode according to claim 1, further comprising an enveloping body which is transmissive to the light generated by the light-emitting diode chips during operation,
wherein the enveloping body abuts all light-emitting diode chips of the light-emitting diode,
wherein the enveloping body is formed with a base material into which particles of a radiation-scattering and/or a radiation-reflecting material have been incorporated, so that the enveloping body is constructed for mixing the light generated by the light-emitting diode chips during operation,
wherein the at least one light-emitting diode chip comprises at least one light-emitting diode chip that emits blue light, at least one light-emitting diode chip that emits red light and at least one light-emitting diode chip that emits green light,
wherein at least two of the light-emitting diode chips are arranged in different planes of the light-emitting diode,
wherein the different planes of the light-emitting diode chips run at least in sections or wholly parallel to one another and are arranged one above the other in a vertical direction which runs transversely or perpendicularly to the planes, and
wherein a spacing between the two light-emitting diode chips which are arranged in different planes is at least the height of one of the light-emitting diode chips.

15. A lighting module comprising:
at least two light-emitting diodes according to claim 1, wherein the light-emitting diodes are arranged one next to the other in lateral directions, and wherein the light-emitting diodes are mechanically connected to one another.

16. The lighting module according to claim 15, wherein each light-emitting diode has a hexagonal outline in plan view, and wherein at least one of the light-emitting diodes abuts six light-emitting diodes in the lateral directions.

17. The lighting module according to claim 15, which has a hexagonal outline in plan view.

* * * * *